(12) United States Patent
Powell et al.

(10) Patent No.: US 7,910,166 B2
(45) Date of Patent: Mar. 22, 2011

(54) SYSTEM AND METHOD FOR DEPOSITING A MATERIAL ON A SUBSTRATE

(75) Inventors: Ricky Charles Powell, Ann Arbor, MI (US); Andrew Kelly Gray, Perrysburg, OH (US); Todd Alden Coleman, Wayne, OH (US)

(73) Assignee: First Solar, Inc., Perrysburg, OH (US)

( * ) Notice: Subject to any disclaimer, the term of this patent is extended or adjusted under 35 U.S.C. 154(b) by 548 days.

(21) Appl. No.: 11/380,079

(22) Filed: Apr. 25, 2006

(65) Prior Publication Data

US 2006/0236938 A1    Oct. 26, 2006

Related U.S. Application Data

(60) Provisional application No. 60/674,677, filed on Apr. 26, 2005.

(51) Int. Cl.
*C23C 16/00* (2006.01)
*H01L 21/20* (2006.01)

(52) U.S. Cl. .................. 427/248.1; 118/726; 118/719

(58) Field of Classification Search .................. None
See application file for complete search history.

(56) References Cited

U.S. PATENT DOCUMENTS

| | | | |
|---|---|---|---|
| 3,858,548 A * | 1/1975 | Tick | 118/724 |
| 3,954,423 A * | 5/1976 | Hamper et al. | 48/107 |
| 3,966,127 A * | 6/1976 | Pytlewski | 241/73 |
| 4,512,868 A * | 4/1985 | Fujimura et al. | 204/298.38 |
| 4,606,776 A * | 8/1986 | Salis | 134/36 |
| 4,987,284 A * | 1/1991 | Fujimura et al. | 219/121.43 |
| 5,174,983 A * | 12/1992 | Snail | 423/446 |
| 5,445,973 A | 8/1995 | Hedström | |
| 5,837,320 A | 11/1998 | Hampden-Smith et al. | |
| 5,994,642 A | 11/1999 | Higuchi et al. | |
| 6,037,241 A * | 3/2000 | Powell et al. | 438/479 |
| 6,444,043 B1 * | 9/2002 | Gegenwart et al. | 118/726 |
| 6,660,328 B1 * | 12/2003 | Dahmen et al. | 427/248.1 |
| 2002/0129769 A1 * | 9/2002 | Kim et al. | 118/723 E |
| 2004/0031442 A1 * | 2/2004 | Yamazaki et al. | 118/727 |

OTHER PUBLICATIONS

US 4,606,776—Derwent abstract, Aug. 1986.*

* cited by examiner

*Primary Examiner* — Timothy H Meeks
*Assistant Examiner* — Joseph Miller, Jr.
(74) *Attorney, Agent, or Firm* — Steptoe & Johnson LLP

(57) ABSTRACT

A method and apparatus for depositing a film on a substrate includes introducing a material and a carrier gas into a heated chamber. The material may be a semiconductor material, such as a cadmium chalcogenide. A resulting mixture of vapor and carrier gas containing no unvaporized material is provided. The mixture of vapor and carrier gas are remixed to achieve a uniform vapor/carrier gas composition, which is directed toward a surface of a substrate, such as a glass substrate, where the vapor is deposited as a uniform film.

7 Claims, 7 Drawing Sheets ns and movement within the chambers themselves can create a flow which results in a uniform mixing of vaporized semiconductor and inert carrier gas. Passing the vapor and carrier gas, but not the powder, through a filter ensures that powder will not be deposited on a surface of the substrate. Reducing or substantially eliminating the amount of powder from the vapor/carrier gas composition and providing a uniform vapor/carrier gas composition results in a deposited film that is substantially uniform as to both thickness and grain structure, resulting in higher-quality and lower-cost production.

SYSTEM AND METHOD FOR DEPOSITING A MATERIAL ON A SUBSTRATE

CLAIM OF PRIORITY

This application claims priority under 35 U.S.C. §119(e) to U.S. Provisional Patent Application Ser. No. 60/674,677 filed Apr. 26, 2005, the entire contents of which is hereby incorporated by reference.

TECHNICAL FIELD

The present invention relates to photovoltaic device production.

BACKGROUND

In the manufacture of a photovoltaic device, semiconductor material is deposited on a glass substrate. This may be accomplished by vaporizing the semiconductor and directing the vaporized semiconductor towards the glass substrate surface, such that the vaporized semiconductor condenses and is deposited on the glass, forming a solid semiconductor film.

SUMMARY

In general, a method and system for depositing a semiconductor material on a substrate includes introducing a material and a carrier gas into a distributor assembly having a heated first chamber to form a vapor of the material. The material can be a powder, for example, a powder of a semiconductor material. The carrier gas and vapor are then directed through a series of successive heated chambers to form a uniform vapor/carrier gas composition. The uniformity of the gas composition can be provided by flow and diffusion of the vapor and gas incident to passing the gases through a plurality of chambers of the distributor assembly. After the composition has become uniform, it is directed out the distributor assembly and towards a substrate, causing a film to be formed on a surface of substrate. The substrate can be a glass substrate or another suitable substrate such as a polymer substrate having a surface suitable for forming a film. The film can be a semiconductor composition. The vapor and carrier gas composition may be passed through a filter after being introduced into the distributor assembly in order to ensure that solid particles of that material are not directed toward the substrate. Advantageously, the method and system for depositing a semiconductor material provides a semiconductor film with improved film thickness uniformity and grain structure uniformity.

In one aspect, a method for depositing a film on a substrate includes directing a powder such as cadmium sulfide or cadmium telluride and an inert carrier gas such as helium through a feed tube into a heated distributor assembly including a network of sequentially connected chambers. The distributor assembly may include a plurality of successively shrouded tubes such that the semiconductor powder and inert gas are introduced through a feed tube into a first heated tube the interior of which is passably connected to the interior of a second chamber. The first heated tube is heated such that the semiconductor powder forms a vapor. The distributor assembly also includes a filter formed such that semiconductor vapor and carrier gas are able to pass through the filter, but semiconductor powder cannot. The vapor and carrier gas are directed through the filter to filter out semiconductor powder. Vapor and carrier as are directed to the second chamber. The second chamber can be a tube, and can be heated. The second chamber can be larger than the first heated tube and provided such that the first heated tube is disposed within the second chamber.

Movement of the vapor and carrier gas through passages between successive chambers of the distributor assembly and movement within the chambers themselves can create a flow which results in a uniform mixing of vaporized semiconductor and inert carrier gas. Passing the vapor and carrier gas, but not the powder, through a filter ensures that powder will not be deposited on a surface of the substrate. Reducing or substantially eliminating the amount of powder from the vapor/carrier gas composition and providing a uniform vapor/carrier gas composition results in a deposited film that is substantially uniform as to both thickness and grain structure, resulting in higher-quality and lower-cost production.

In another aspect, a system for depositing a material on a substrate includes a heated distributor assembly having a plurality of sequentially connected chambers into which a powder and a carrier gas are introduced. The system includes a feed tube through which the powder and carrier gas are introduced into the first chamber of the distributor assembly. The distributor assembly may be heated by applying a current across one or more chambers included in the distributor assembly, or by another means that will heat at least a portion of the distributor assembly to a temperature sufficient to form a vapor from the powder. A heating element may be provided in the first chamber. One or more chambers in the distributor assembly may be heated in order to heat at least a portion of the distributor assembly. The system also includes a filter permeable to vapor and carrier gas but not powder to substantially prevent powder from exiting the distributor assembly and being deposited on a surface of a substrate. The filter may be positioned within the first chamber.

The chambers in the distributor assembly are provided such that the vapor and carrier gas travel within each chamber and from each chamber to a successive chamber. A second chamber is provided proximate to the first chamber where the powder and carrier gas is introduced to the distributor assembly. After the powder is vaporized in the first chamber, it is directed into the proximate second chamber. The chambers included in the distributor assembly may be provided as a plurality of successively shrouded tubes such that the vapor and carrier gas are introduced into a first chamber which is a tube disposed within (e.g., shrouded by) another tube. The shrouded tube includes one or more apertures through which the vapor and carrier gas are directed from the shrouded tube to the shroud tube.

The chambers included in the distributor assembly may also be non-tubular. The distributor assembly provides a flow pattern for the vapor and carrier gas such that a uniform vapor/carrier gas composition is obtained as the vapor and carrier gas are directed within each chamber and between the chambers included in the distributor assembly. An outlet can be provided at the end of the distributor assembly and is positioned such that the uniform vapor/carrier gas composition directed through the distributor assembly and outlet is directed toward a surface of a substrate upon which the semiconductor is deposited as a film on a surface of the substrate. The outlet may be positioned proximate to the second chamber. Where the last chamber through which the vapor/carrier gas composition can be directed is a tube, the outlet may be a slot oriented along the length of the tube. The outlet may also include a manifold having a plurality of orifices through which the vapor and carrier gas are directed toward the substrate.

The substrate upon which the film is deposited can be introduced in the proximity of the distributor assembly outlet by a conveyor system The conveyor system may include a gas hearth for supporting and transporting a plurality of substrates past the distributor assembly outlet for deposition.

The method and system described here have the advantage over known systems and methods of depositing a semiconductor film on a substrate of providing a film of uniform thickness and grain structure. These properties can be important, particularly with respect to the use of semiconductor films in solar panels. The method and system described here also provide improved definition of the film deposition area, resulting in higher material utilization. As a result, the method and system described result in higher efficiency in the production of solar panels than is provided with known methods and systems.

The method can provide a material film having a uniform thickness and composition. A solid introduced into the system can be maintained at a temperature sufficient to vaporize the material for a duration of time sufficient to ensure that substantially all the material that is passed through the system forms a vapor, and the vapor and carrier gas are directed through a filter, while the unvaporized solid cannot pass through the filter. The filtered product includes substantially no solid material, thereby preventing solid material from being directed toward a surface of a substrate and resulting in an irregular resulting film. Additionally, a solid to be vaporized and a carrier gas introduced into the system are passed through the system in such a manner that the vapor and the carrier gas mix to form and maintain a uniform composition; segregation between the vapor and the carrier gas which can occur when passing through a permeable structure such as a filter on account of the different in molecular weight between the vapor and carrier gas is substantially reduced.

The details of one or more embodiments are set forth in the accompanying drawings and the description below. Other features, objects, and advantages will be apparent from the description and drawings, and from the claims.

DETAILED DESCRIPTION

An apparatus and method for depositing a semiconductor film on a glass substrate are described, for example, in U.S. Pat. No. 6,037,241, the disclosure of which is herein incorporated by reference in its entirety.

A solid material such as a semiconductor powder and carrier gas can be introduced into a heated permeable tubular chamber, where the solid material is vaporized. The vapor and carrier gas then pass through the walls of the heated permeable chamber into a shroud surrounding the chamber. The shroud can include an opening through which the vapor is directed toward a surface of a substrate, such as a glass substrate, where it is deposited as a film.

Figure 1:
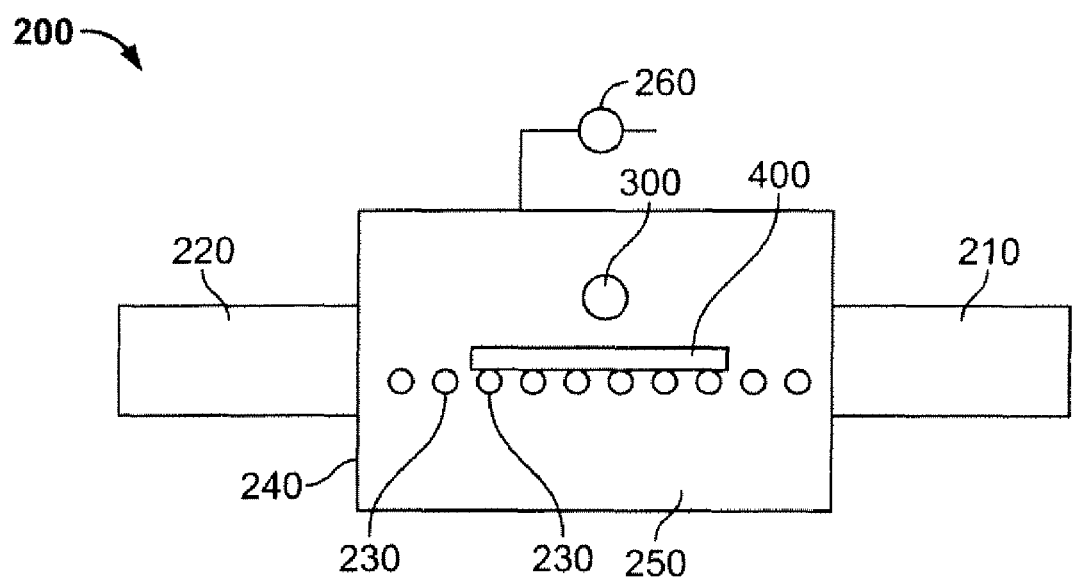
FIG. 1 is a drawing depicting a system for depositing a semiconductor on a glass sheet substrate.

With reference to FIG. 1 of the drawings, a substrate processing system 200 includes distributor assembly 300. Both the distributor assembly 300 and the method for processing a substrate 400 are described and exemplified here.

With continuing reference to FIG. 1, the system 200 includes a housing 240 defining a processing chamber 250 in which a material is deposited on a substrate 400. Substrate 400 can be a glass sheet. Housing 240 includes an entry station 210 and an exit station 220. Entry station 210 and exit station 220 can be constructed as load locks or as slit seals through which substrate 400 enters and exits the processing chamber 250. The housing 240 can be heated in any suitable manner such that its processing chamber can be maintained at a deposition temperature. The distributor temperature can be 500 degrees to 1200 degrees C. Substrate 400 can be heated during the processing to a substrate temperature. The substrate temperature can be 200 degrees to 650 degree C. Substrate 400 can be transported by any appropriate means such as rollers 230, or a conveyor belt, preferably driven by an attached electric motor.

Figure 2:
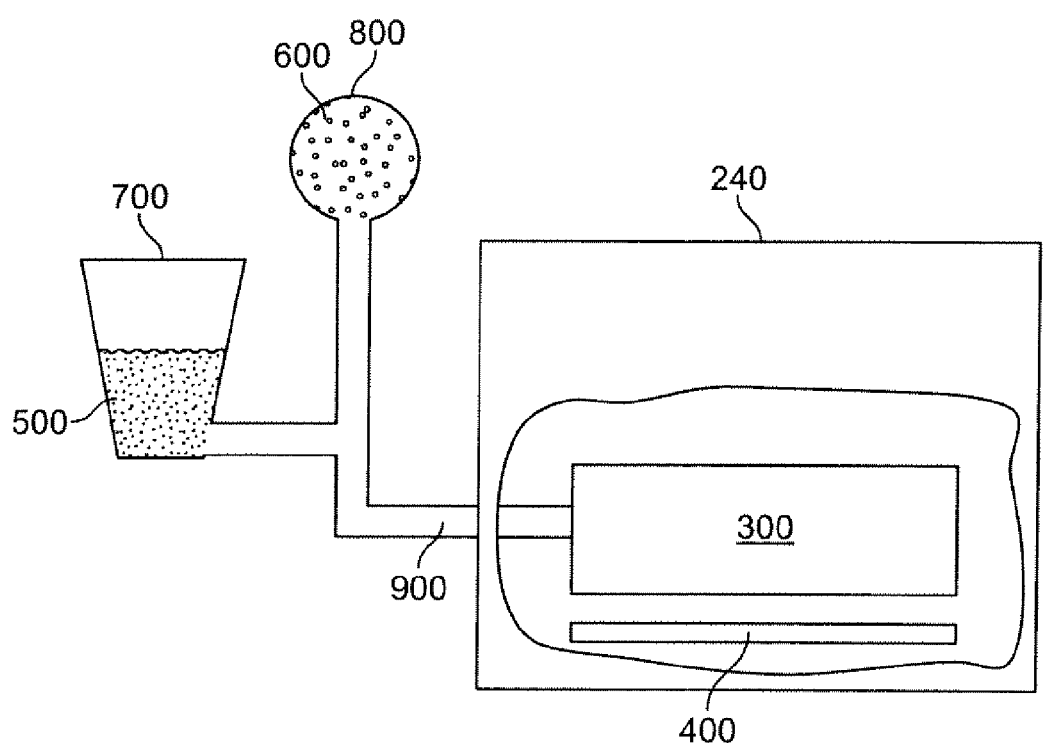
FIG. 2 is a drawing depicting a material supply for introducing a semiconductor powder and a carrier gas into a distributor assembly.

With reference to FIG. 2, distributor assembly 300 contained in housing 240 is connected by feed tube 900 to a material supply which can include a hopper 700 containing a powder 500 and a carrier gas source 800 containing an appropriate carrier gas 600. Powder 500 can contact carrier gas 600 in feed tube 900, and both carrier gas 600 and powder 500 are introduced into distributor assembly 300.

After carrier gas 600 and powder 500 are introduced into distributor assembly 300, powder 500 is vaporized and directed through distributor assembly 300 along with carrier gas 600 in such a manner that carrier gas 600 and the vapor are mixed to form a uniform vapor/carrier gas composition. The uniform vapor/carrier gas composition is then directed out of distributor assembly 300 toward substrate 400. The lower temperature of substrate 400 compared to the temperature in distributor assembly 300 in order to maintain the material in vapor phase, causes condensation of the vapor on a surface of substrate 400, and the deposition of a film, which has a substantially uniform thickness and a substantially uniform structure demonstrating a uniform crystallization and a substantial absence of particulate material such as unvaporized powder.

The exit point of the semiconductor vapor from distributor assembly 300 can be spaced from substrate 400 at a distance in the range of about 0.5 to about 5.0 cm to provide more efficient deposition. While greater spacing can be utilized, that may require lower system pressures and would result in material waste due to overspraying. Furthermore, smaller spacing could cause problems due to thermal warpage of substrate 400 during conveyance in the proximity of the higher temperature distributor assembly 300. Substrate 400 can pass proximate to the point where the semiconductor vapor exists distributor assembly 300 at a speed of at least about 20 mm per second to about 40 mm per second.

In performing the deposition, successful results have been achieved using cadmium telluride and cadmium sulfide as the material. However, it should be appreciated that other materials can be utilized which include a transition metal (Group IIB) and a chalcogenide (Group VIA). It should be further appreciated that additional materials that can be utilized to form a semiconductor film have many useful applications (such as the manufacture of photovoltaic devices) and may be used with the present invention. Also, dopants may be useful to enhance the deposition and properties of the resulting film.

Use of system 200 to perform the method of the invention has been performed with a vacuum drawn in the processing chamber 250 to about 0.5 to 760 Torr. In that connection, as illustrated in FIG. 1, the processing system 200 includes a suitable exhaust pump 260 for exhausting the processing chamber 250 of the housing 240 both initially and continuously thereafter to remove the carrier gas.

The carrier gas 600 supplied from the source 800 can be helium, which has been found to increase the glass temperature range and the pressure range that provide film characteristics such as deposition density and good bonding. Alternatively, the carrier gas can be another gas such as nitrogen, neon, argon or krypton, or combinations of these gases. It is also possible for the carrier gas to include an amount of a reactive gas such as oxygen that can advantageously affect growth properties of the material. A flow rate of 0.3 to 10 standard liters per minute of the carrier gas has been determined to be sufficient to provide the material flow to distributor assembly 300 for deposition on a substrate.

Figure 3:
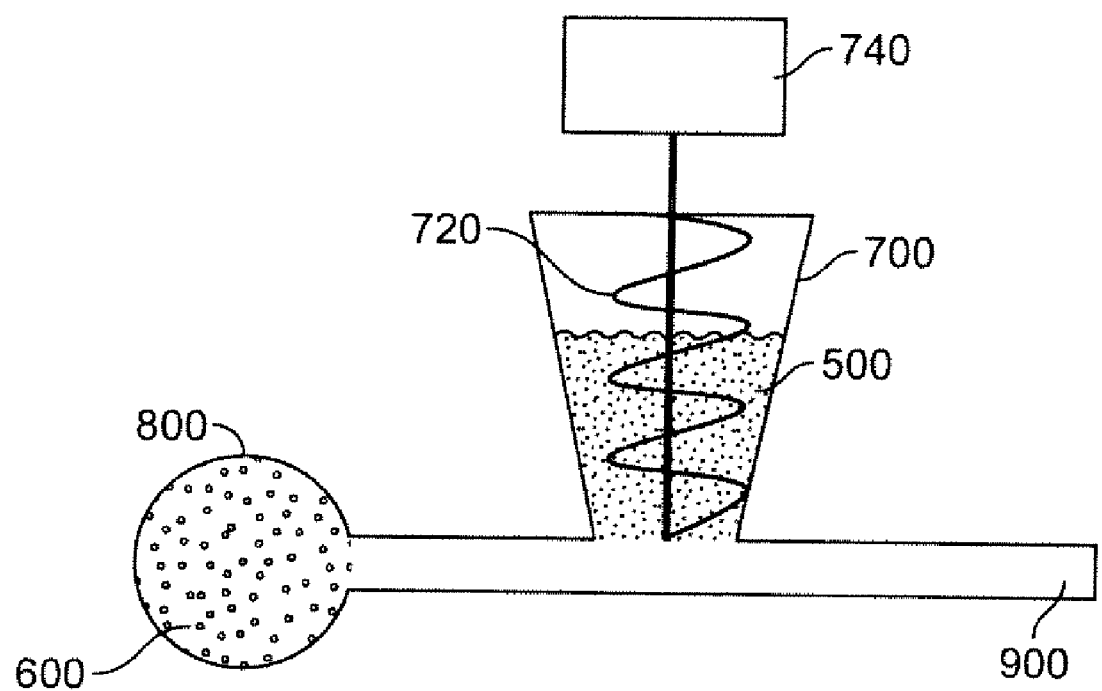
FIG. 3 is a drawing depicting an embodiment of a material supply.
Figure 4:
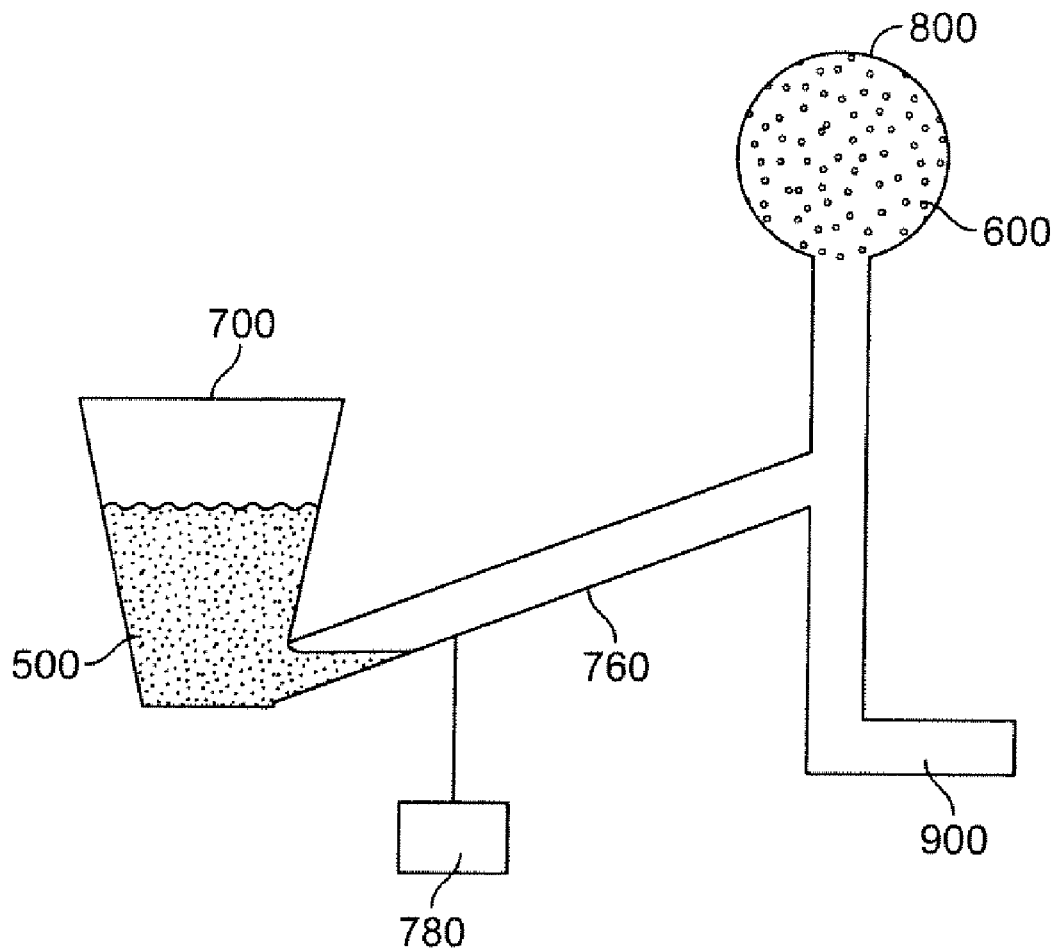
FIG. 4 is a drawing depicting an alternate embodiment of a material supply in accordance with the present invention.

It should be recognized that multiple material supplies having multiple hopper and multiple carrier gas sources may introduce carrier gas and material into the distributor assembly. A single material supply is shown in FIG. 2 and subsequent figures for the sake of clarity. FIG. 3 and FIG. 4 depict alternate embodiments of a material supply which can be used. As shown in FIG. 3, hopper 700 containing powder 500 may include a rotary screw 720, which, when rotated by actuator 740 delivers powder 500 into feed tube 900, where it is introduced into carrier gas 600 delivered from carrier gas source 800. Alternatively, as shown in FIG. 4, a vibration-actuated material source is depicted, in which a vibration introduced by vibratory feeder 780 causes powder 500 to incrementally move from hopper 700 into inclined passage 760. In this manner, powder is introduced into feed tube 900, along with carrier gas 600 from carrier gas source 800.

Figure 5:
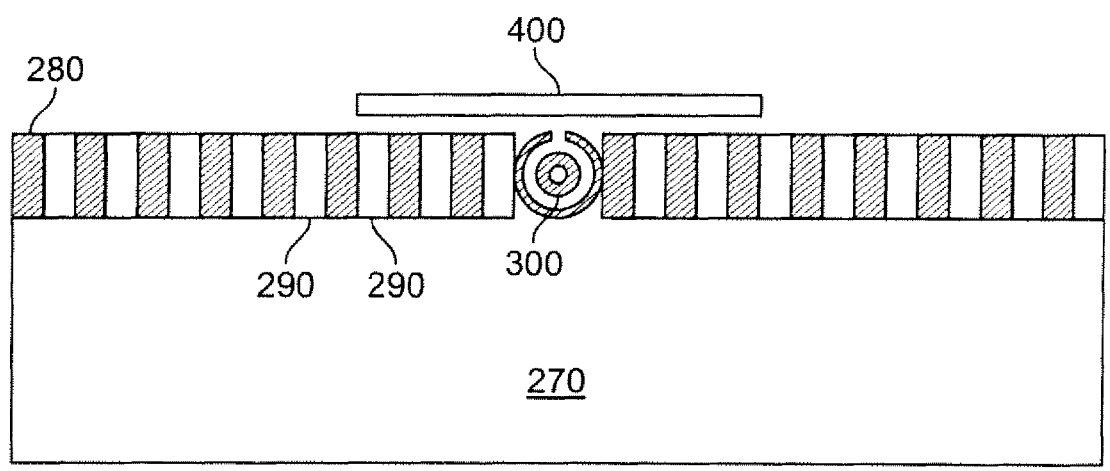
FIG. 5 is a drawing depicting an embodiment of a system for depositing a semiconductor on a downward-facing surface of a glass sheet substrate.

FIG. 5 represents an alternative embodiment of system 200 in which a semiconductor film may be deposited on a downward-facing surface of substrate 400. The alternate system depicted includes a refractory hearth 280 above a plenum 270 of heated pressurized gas. Holes 290 in hearth 280 provide for upward flow of the pressurized heated gas so as to support glass substrate 400 in a floating manner. As floating glass substrate 400 is conveyed along the length of hearth 280, the downward-facing surface passes proximate to distributor assembly 300, from which semiconductor vapor is directed toward and deposited as a film on substrate 400.

Various embodiments of distributor assembly 300 are described below.

Figure 6:
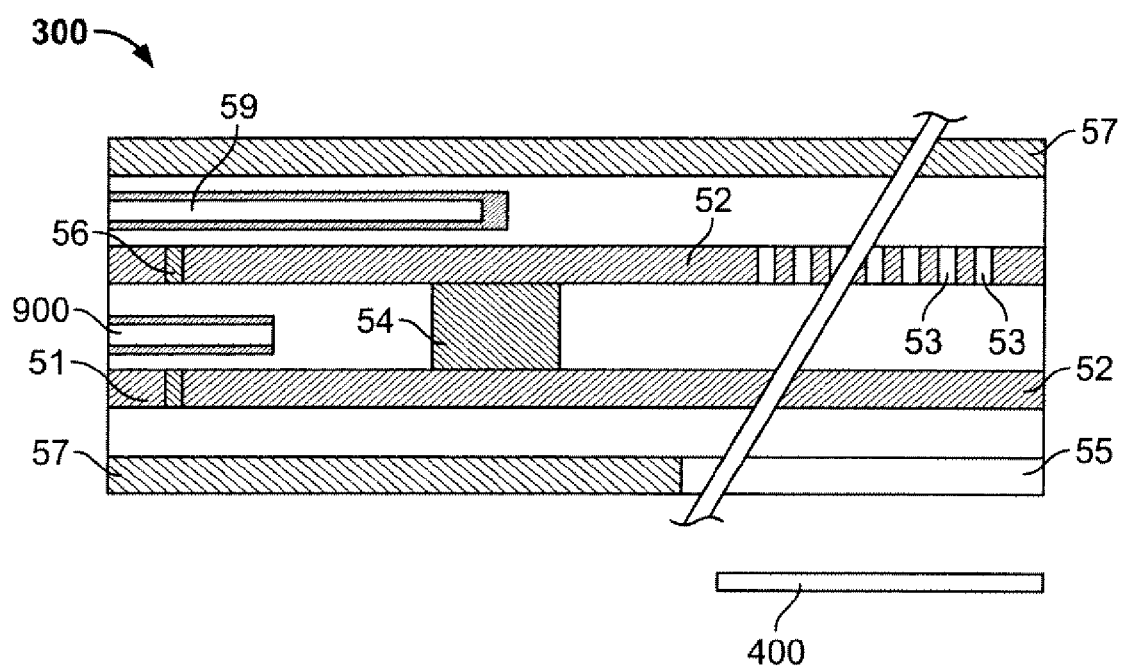
FIG. 6 is a drawing depicting an embodiment of a distributor assembly.

FIG. 6 depicts a cross section view taken along the length of a distributor assembly 300. A carrier gas and a powder are introduced through feed tube 900 into heater tube 52. Heater tube 52 can be resistively heated by applying current across the length of heater tube 52 and is preferably formed from substantially impermeable graphite or SiC. The powder and carrier gas are heated in heater tube 52, causing the powder to vaporize. The vapor and carrier gas are then directed through filter 54 provided in heater tube 52. Filter 54 can be formed from a material that is permeable to the carrier gas and vapor, but not to the powder, thereby ensuring that no powder is ultimately deposited on the substrate. Heater tube 52 may be joined by internal joints 56 to low-resistance electrified ends 5X, which are not permeable.

After the vapor and carrier gas are directed through filter 54, the mixture is directed into a portion of heater tube 52 having a plurality of outlets 53, which are preferably holes drilled in a line on one side of heater tube 52. The vapor and carrier gas are then directed through outlets 53 into the interior of an outer tubular sheath 57 which shrouds heater tube 52. Outer tubular sheath 57 can be formed from mullite. During the passage through heater tube 52 and into and within outer tubular sheath 57, the irregular flow of the vapor and carrier gas results in continuous mixing of the vapor and the carrier gas to provide a uniform vapor/carrier gas composition. As shown in FIG. 6, the interior of outer tubular sheath 57 can include a thermowell 59 for monitoring the temperature of distributor assembly 300.

The uniform vapor/carrier gas composition is directed within the interior of outer tubular sheath 57 and toward a slot 55, which is preferably located on the side of outer tubular sheath substantially opposite outlets 53 to provide a lengthy and indirect pathway for the vapor and carrier as, thereby dispersing the streams of uniform vapor/carrier gas composition directed from outlets 53 and promoting maximum mixing and uniformity of gas composition, pressure and velocity. The uniform vapor/carrier gas composition is directed out of outer tubular sheath 57 through slot 55 and the film of material is deposited on underlying substrate 400.

It should be appreciated that FIG. 6 depicts a portion of distributor assembly 300 and an additional feed tube and internal filter may be provided at an opposite end of distributor assembly 300, which is not shown in FIG. 6.

Figure 7:
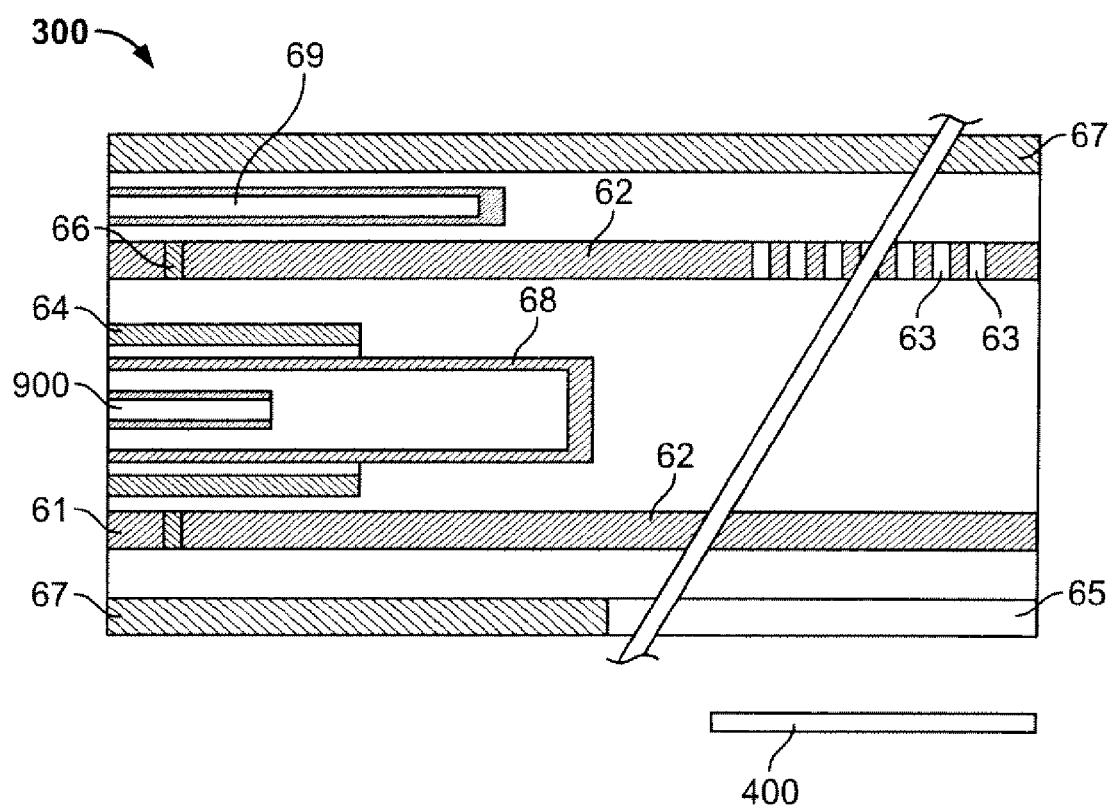
FIG. 7 is a drawing depicting an embodiment of a distributor assembly.

FIG. 7, like FIG. 6, depicts a cross section view taken along the length of a distributor assembly 300. According to this embodiment, a carrier gas and a powder are introduced through fed tube 900 into heater tube 62. Feed tube 900 can be formed from mullite or aluminum oxide and can have an outer diameter of about 5 mm to about 15 mm (preferably about 7 mm), and an inner diameter of about 3 mm to about 10 mm (preferably about 5 mm). Heater tube 62 can be resistively heated by applying a current across the length of heater tube 62 and can be formed from graphite or SiC. Heater tube 62 can have an outer diameter of about 25 mm to about 75 mm (preferably about 54 mm), and an inner diameter of about 20 mm to about 50 mm (preferably about 33 mm). The powder and carrier gas are heated in heater tube 62, causing the powder to vaporize.

In contrast to the embodiment described above in which the vapor and carrier gas were directed through an internal filter, in the embodiment described with reference to FIG. 7, after heating, the vapor and carrier gas are then directed through cantilevered internal filter 68 which is formed from SiC and is permeable to the vapor and the carrier gas. Internal filter 68 can have an outer diameter of about 10 mm to about 30 mm (preferably about 20 mm), and an inner diameter of about 5 mm to about 15 mm (preferably about 9 mm). The vapor and carrier gas are directed through cantilevered internal filter 68 into the interior of heater tube 62. Isolation sleeve 64 is provided to prevent electrical arcs between cantilevered internal filter 68 and heated sleeve 64, resulting in heater failure. Isolation sleeve 64 can be made from a non-conductive material such as mullite or aluminum oxide and can have an outer diameter of about 20 mm to about 40 mm (preferably about 32 mm), and an inner diameter of about 20 mm to about 30 mm (preferably about 25 mm). Heater tube 62 may be joined by internal joints 66 to low-resistance electrified ends 61.

The vapor and carrier gas are then directed through a plurality of outlets 63, which can be drilled holes formed in a line on one side of heater tube 62. Outlets 63 can have a diameter of about 2 mm to about 5 mm (preferably about 3 mm), and can number about 15 to about 40 along the length of heater tube 62. The vapor and carrier gas enter the interior of a outer tubular sheath 67, which shrouds heated tube 62. Outer tubular sheath 67 can be formed from mullite. During the passage through heater tube 62 and into and within outer tubular sheath 67, the irregular flow of the vapor and carrier gas results in continuous mixing of the vapor components and carrier gas to form a uniform vapor/carrier gas composition. The interior of outer tubular sheath 67 can also include a thermowell 69, which can be formed from aluminum oxide and can have an outer diameter of about 5 mm to about 10 mm (preferably about 7 mm), for monitoring the temperature of distributor assembly 300.

The uniform vapor/carrier gas composition is directed within the interior of outer tubular sheath 67, dispersing the streams of vapor and carrier gas directed from outlets 63 and increasing the uniformity of composition, pressure and velocity of the vapor and carrier gas. The uniform vapor/carrier gas composition is directed ad toward a slot 65, which can be located on a side of outer tubular sheath 67 substantially opposite outlets 63 to provide a lengthy and indirect path for the vapor and carrier gas, thereby promoting maximum mixing and uniformity of the vapor/carrier gas composition. The uniform vapor/carrier gas composition is directed out of outer tubular sheath 67 through slot 65 and is deposited on a surface of underlying substrate 400.

It should be appreciated that as with FIG. 6, FIG. 7 depicts a portion of distributor assembly 300 and an additional feed tube and cantilevered internal filter may be provided at an opposite end of distributor assembly 300, which is not shown in FIG. 7.

The embodiments described above are offered by way of illustration and example. It should be understood that the examples provided above may be altered in certain respects and still remain within the scope of the claims. For example, the component dimensions described above are suitable for use with substrates up to 60 cm wide; adjustments can be made when using substrates of different sizes. It should be appreciated that, while the invention has been described with reference to the above preferred embodiments, other embodiments are within the scope of the claims.

What is claimed is:

1. A method for depositing a material on a substrate, comprising:
   introducing a material including a powder and a carrier gas into a first chamber including an interior, wherein
   the first chamber is tubular and comprises:
      a heating element positioned within the interior of the first chamber and heated by resistive heating to a temperature high enough that at least a portion of the powder vaporizes into a vapor;
      a filter positioned within the interior of the first chamber to allow passage of vapor and carrier gas but not solid material; and
      a plurality of distribution holes;
   heating the material such that at least a portion of the material vaporizes into a vapor and passes through the filter;
   passing the vapor through at least one of the plurality of distribution holes in the first chamber into a second chamber, wherein the second chamber is tubular and is positioned outside the first chamber so that the second tubular chamber sheaths at least a portion of the first tubular chamber, and the second chamber is positioned to provide a material flow for the vapor that is sufficiently indirect to mix the vapor and the carrier gas into a substantially uniform vapor/carrier gas composition; and
   directing the substantially uniform vapor/carrier gas composition through an outlet proximate to the second chamber and toward a surface of a substrate proximate to the second chamber and having a temperature lower than the vapor.

2. The method of claim 1, wherein the filter comprises a cantilevered tubular filter positioned inside the first chamber.

3. The method of claim 2, wherein the cantilevered tubular filter is resistively heated.

4. The method of claim 1, wherein the material is a cadmium chalcogenide.

5. The method of claim 4, wherein the material is cadmium telluride or cadmium sulfide.

6. The method of claim 4, wherein the heating includes maintaining the first chamber at a temperature of at least 500 degrees C.

7. The method of claim 6, wherein the heating includes maintaining the first chamber at a temperature of at least 700 degrees C.

* * * * *

UNITED STATES PATENT AND TRADEMARK OFFICE
CERTIFICATE OF CORRECTION

Page 1 of 1

PATENT NO. : 7,910,166 B2
APPLICATION NO. : 11/380079
DATED : March 22, 2011
INVENTOR(S) : Rick C. Powell It is certified that error appears in the above-identified patent and that said Letters Patent is hereby corrected as shown below:

In the Specification:

Column 5, line 59, "5x" should read --51--

Column 6, line 25, "fed" should read --feed--

Column 6, line 48, "heated sleeve 64" should read --heater tube 62--

Column 6, line 60, "heated" should read --heater--

Signed and Sealed this
Thirteenth Day of September, 2011

David J. Kappos
*Director of the United States Patent and Trademark Office*